United States Patent
Auerbach et al.

(10) Patent No.: US 8,489,367 B2
(45) Date of Patent: Jul. 16, 2013

(54) MODELING A MATRIX FOR FORMAL VERIFICATION

(75) Inventors: Gadiel Auerbach, Haifa (IL); David J. Levitt, Haifa (IL)

(73) Assignee: International Business Machines Corporation, Armonk, NY (US)

(*) Notice: Subject to any disclaimer, the term of this patent is extended or adjusted under 35 U.S.C. 154(b) by 905 days.

(21) Appl. No.: 12/569,909

(22) Filed: Sep. 30, 2009

(65) Prior Publication Data

US 2011/0077915 A1 Mar. 31, 2011

(51) Int. Cl.
  *G06F 7/60* (2006.01)
  *G06F 17/10* (2006.01)
(52) U.S. Cl.
  USPC .................................................. 703/2
(58) Field of Classification Search
  USPC ............................................. 703/2; 716/106
  See application file for complete search history.

(56) References Cited

U.S. PATENT DOCUMENTS

| | | | | |
|---|---|---|---|---|
| 5,369,594 A | * | 11/1994 | Huang et al. | 716/136 |
| 6,101,323 A | * | 8/2000 | Quarles et al. | 703/2 |
| 8,060,355 B2 | * | 11/2011 | Kerns et al. | 703/14 |
| 2003/0149962 A1 | * | 8/2003 | Willis et al. | 717/135 |
| 2008/0140364 A1 | | 6/2008 | Friedman et al. | |
| 2009/0132991 A1 | * | 5/2009 | Ganai et al. | 716/18 |

OTHER PUBLICATIONS

M. Hasan et al., "Matrix Row-Column Sampling for the Many-Light Problem", SIGGRAPH 2007 http://www.cs.cornell.edu/~mhasan/mxsmp.pdf.

* cited by examiner

*Primary Examiner* — Dwin M Craig
(74) *Attorney, Agent, or Firm* — Ziv Glazberg; Glazberg & Applbaum Co.

(57) ABSTRACT

A reference model may be defined to refer to a matrix of a target computerized system. The reference model may comprise a reference index and a reference matrix. The reference index may have a non-deterministic value enabling the reference matrix to refer to the matrix using a fewer number of cells. The disclosed subject matter may enable a more efficient model checking process of a computerized device by using a reference model that is relatively easy to define or maintain or by using a reference model that is configured to be more efficient for model checking as it uses non-determinism.

14 Claims, 4 Drawing Sheets

MODELING A MATRIX FOR FORMAL VERIFICATION

BACKGROUND

The present disclosure relates to quality assurance of computerized systems in general, and to formal verification of computerized systems in particular.

Computerized devices are an important part of the modern life. Such devices control almost every aspect of our life—from writing documents to controlling traffic lights. However, computerized devices are bug-prone, and thus require a testing phase in which the bugs should be discovered. The testing phase is considered one of the most difficult tasks in developing a computerized device. Many developers of computerized devices invest a significant portion, sometimes as much as 70%, of the development cycle to discover erroneous behaviors of the computerized device, also referred to as a target computerized system. The target computerized system may comprise hardware, software, firmware, a combination thereof and the like.

During the testing phase, formal verification techniques may be applied to verify that a predetermined property is held. Formal verification may utilize a model checker to verify that the predetermined property is held. In some cases, a reference model is used in order to verify a model. The model may be designed by a chip designer, a software engineer or the like, and it represents the target computerized system, as designated to be produced. The model may comprise portions that are designed to increase efficiency or performance of the target computerized system, such as for example reducing power requirements, decreasing times a memory is accessed, using various storage devices such as a flash device in addition to a hard disk, accumulating data to a buffer before outputting the data and the like.

BRIEF SUMMARY OF THE INVENTION

One exemplary embodiment of the disclosed subject matter is a method comprising: obtaining a specification of a matrix, the matrix has a first predetermined dimension, the matrix comprises one or more cells, each cell having a value, the specification comprises a transition relation defining transformation of a first state of the matrix to a second state of the matrix; defining a reference model of the matrix comprising: defining a reference index, the reference index has a non-deterministic value; defining a reference matrix comprising one or more reference cells, the reference matrix having a second predetermined dimension, the second predetermined dimension is smaller than the first predetermined dimension, each of the reference cells corresponds to two or more cells of the matrix, wherein the reference model preserves the specification, a value of a portion of the reference cells depends on a value of the reference index; and producing the reference model on a computer readable media; whereby the matrix is transformed to a reference model, preserving a behavior defined by the specification, and whereby the reference model comprises a fewer number of cells than the matrix.

Another exemplary embodiment of the disclosed subject matter is a computerized apparatus comprising: a processor; an interface for obtaining a specification of a matrix, the matrix comprising one or more cells; a non-determinism inserter for defining a reference model, the reference model comprising: a reference index, the reference index associated with a non-deterministic value; a list of one or more cells associated with the reference index, the list and a value of the reference index are associated with a portion of the matrix; and an operation modifier for modifying an operation on the matrix to operate on the list.

Yet another exemplary embodiment of the disclosed subject matter is a computer program product comprising: a computer readable medium; first program instruction for obtaining a specification of a matrix, the matrix has a first predetermined dimension, the matrix comprises one or more cells, each cell having a value, the specification comprises a transition relation defining transformation of a first state of the matrix to a second state of the matrix; second program instruction for defining a reference model of the matrix comprising: third program instruction for defining a reference index, the reference index has a non-deterministic value; fourth program instruction for defining a reference matrix comprising one or more reference cells, the reference matrix having a second predetermined dimension, the second predetermined dimension is smaller than the first predetermined dimension, each of the reference cells corresponds to two or more cells of the matrix, wherein the reference model preserves the specification, a value of a portion of the reference cells depends on a value of the reference index; and fifth program instruction for producing the reference model on a computer readable media; wherein the first, second, third, fourth and fifth program instructions are stored on said computer readable media.

THE BRIEF DESCRIPTION OF THE SEVERAL VIEWS OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings.

DETAILED DESCRIPTION

Figure 1:
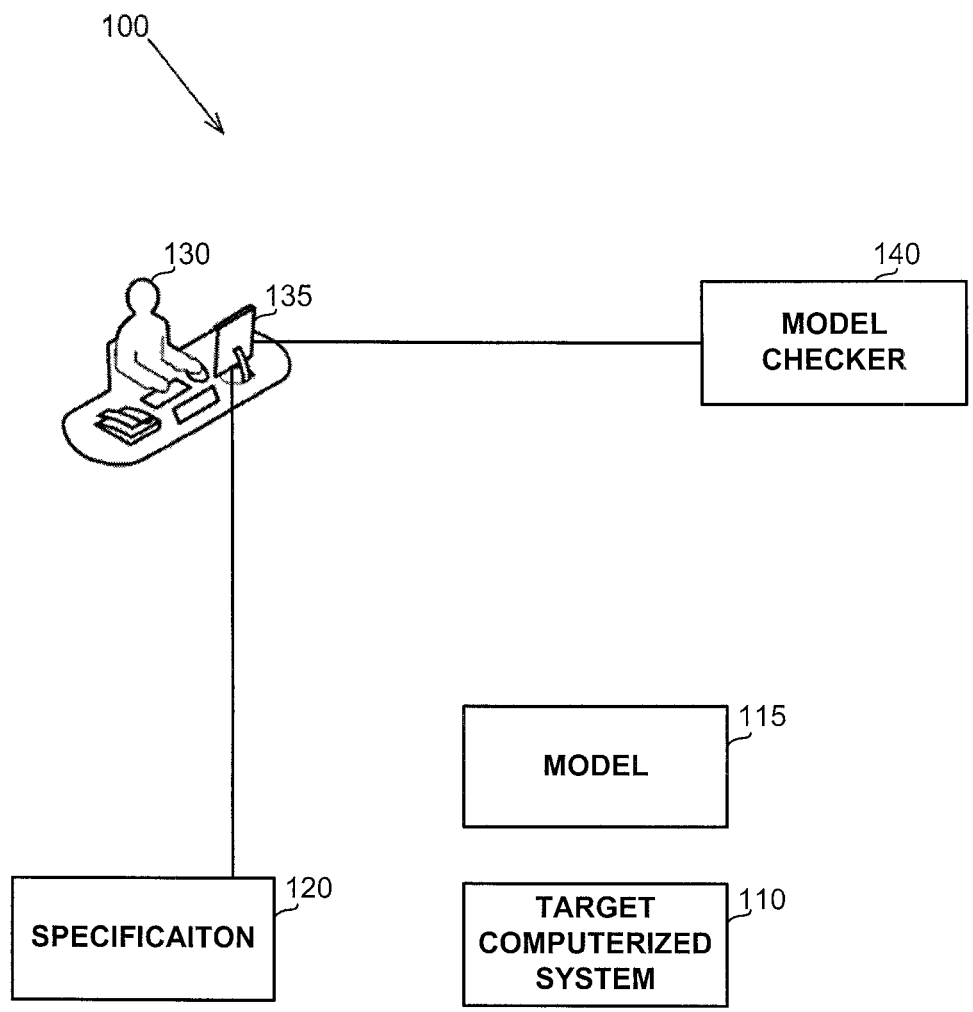
FIG. 1 shows a computerized environment in which the disclosed subject matter is used, in accordance with some exemplary embodiments of the subject matter.

The disclosed subject matter is described below with reference to flowchart illustrations and/or block diagrams of methods, apparatus (systems) and computer program products according to embodiments of the subject matter. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

One technical problem dealt with by the disclosed subject matter is to provide a reference model of a matrix. Another technical problem dealt with by the disclosed subject matter is to provide a reference model of a matrix that is easily designed or configured to be efficient for model checking.

One technical solution is to determine a reference model comprising a reference matrix and a reference index, each cell of the reference matrix corresponds to several cells in the matrix. Another technical solution is to configure the reference index to have non-deterministic value. Yet another technical solution is to determine a cell of the matrix that corresponds to the cell of the reference matrix based on the value of the reference index. Yet another technical solution is to determine a reference model comprising a reference matrix corresponding to several sub-matrices contained within the matrix, the reference matrix represents a specific sub-matrix depending on a value of an index.

One technical effect of utilizing the disclosed subject matter is providing a relatively small reference model that is configured to be model checked efficiently. Another technical effect of utilizing the disclosed subject matter is providing a reference model which comprises non-deterministic behavior representing all possible behaviors of the matrix, with fewer bits of information to represent a state. Yet another technical effect of utilizing the disclosed subject matter is providing a reference model which is relatively easy to design although it represents a complex behavior. Yet another technical effect of utilizing the disclosed subject matter is determining a reference model which is relatively easy to maintain and modify in accordance with modification of the specification.

Referring now to FIG. 1 showing a computerized environment in which the disclosed subject matter is used, in accordance with some exemplary embodiments of the subject matter.

A computerized environment 100 comprises a target computerized system 110. The target computerized system 110 may comprise hardware, software, firmware, a combination thereof and the like.

A model 115 may correspond to the target computerized system 110. The model 115 may be defined in a descriptive language, such as for example VHDL, Verilog, SystemC, C++, UML, Java or the like. The model 115 may be configured to provide for an efficient execution of the target computerized system 110, such as by reducing power consumption, number of system calls, memory usage, utilizing cache or several types of storage devices, reducing page faults, utilizing predetermined protocols or the like. In some exemplary embodiments, the model 115 is utilized to produce the target computerized system 110, such as for example by compiling the model 115, printing a circuit board in accordance with the model 115, generating source code in respect to the model 115 or the like.

A specification 120 of the target computerized system 110 may define a behavior of the target computerized system 110. The specification 120 may comprise a transition relation defining a transition of a first state of the target computerized system 110 to a second state. The specification 120 may further comprise an initial state of the target computerized system 110, such as starting with initialized variables or the like. In some exemplary embodiments, the specification 120 may comprise several initial states. The specification 120 may further comprise a definition of an output of the target computerized system 110 based on the state of the target computerized system 110.

A verification engineer 130, a similar quality assurance personal or the like may inspect the specification 120. The verification engineer 130 may determine a specification property in accordance with the specification 120 to verify that the model 115 preserves the specification 120. In the present disclosure, a model preserving a specification means that the model is in line with the behavior defined in the specification, i.e. exhibiting the behavior defined by the specification and only that behavior.

In some exemplary embodiments, the verification engineer 130 or an automated reference model designer (not shown) may determine a reference model (not shown) that preservers the specification 120. In some exemplary embodiments, the reference model may be utilized to verify that an output of the reference model is the same or has an equivalent value as the output of the model 115. In some exemplary embodiments, the reference model may be utilized to verify that a portion of the model has the same or an equivalent value as a corresponding portion in the reference model. It will be noted that in some exemplary embodiments the reference model be have abstracted values utilized to decrease a size of a state or the like.

The verification engineer 130 may utilize a terminal 135, such as a Personal Computer (PC), a laptop, a mobile device, a keyboard, a pointing device, a display or the like in order to view the specification 120 or the model 115, to design and produce the reference model or the like.

In some exemplary embodiments, the verification engineer may utilize a model checker 140 to verify that the model 115 preserves the specification 120.

In some exemplary embodiments, the specification 120 comprises a definition of a matrix. The matrix may be a sparse matrix having relatively a large number of cells having the same value, such as for example ZERO. In some exemplary embodiments, the specification 120 may further comprise other components in addition to the matrix. In some exemplary embodiments the matrix has two dimensions. In other exemplary embodiments, the matrix has three dimensions or more. For clarity, the present disclosure refers to a matrix as a two-dimensional matrix having a list of rows or a list of columns. However, the disclosed subject matter is not limited to only such matrices. It will be noted that some data structures, such as an array of linked lists, may be transformed to a matrix. A matrix in the present disclosure may also cover such data structures that may be converted or transformed to a matrix, such as an array of linked lists, a linked list of arrays, a single-dimension array and the like.

Figure 2:
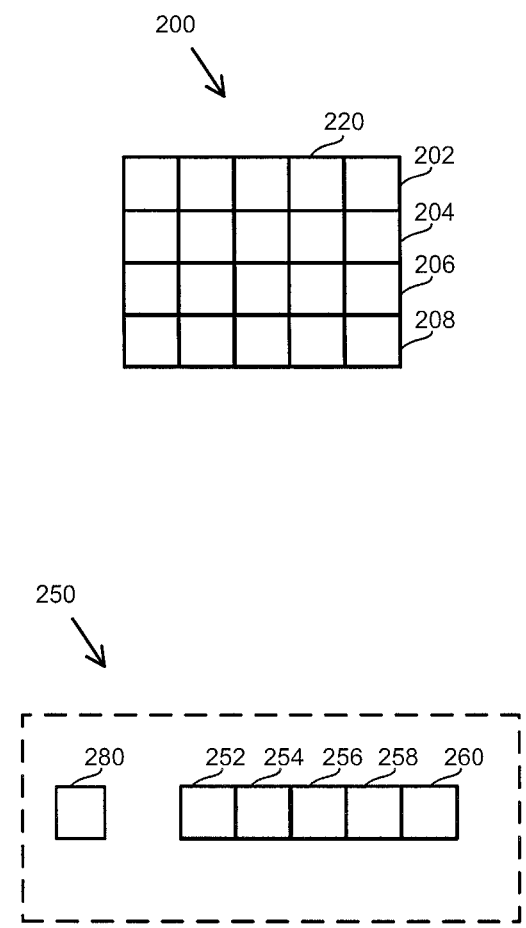
FIG. 2 shows an exemplary matrix and a reference matrix, in accordance with some exemplary embodiments of the disclosed subject matter.

Referring now to FIG. 2 showing an exemplary matrix and a reference matrix, in accordance with some exemplary embodiments of the disclosed subject matter.

In an exemplary embodiment of the disclosed subject matter, a matrix 200 comprises of rows 202, 204, 206 and 208. Each of the rows 202, 204, 206, 208 comprise of five cells. The matrix 200 may alternatively be viewed as having five columns, each having four cells.

In an exemplary embodiment of the disclosed subject matter, a reference model 250 comprises a list of cells 252, 254, 256, 258 and 260. The cells 252, 254, 256, 258, 260 may correspond to all rows in the matrix 200. A value of a cell, such as cell 258, may correspond to any of the cells in column 220, depending on a reference index 280. For example, the reference index 280 may determine that the list of cells 252, 254, 256, 258, 260 correspond to row 204 of the matrix 200. In some exemplary embodiments, the reference index 280 may be configured to receive a value non-deterministically such that the cell 258 may correspond to any of the cells in column 220.

In an exemplary embodiment of the disclosed subject matter, the reference model 250 preserves the specification of the matrix 200 and is designed to be efficient for model checking. For example, a behavior of a value of a cell in a column, such as column 220, is relatively similar to other cells in the column and it may depend mostly on values of other cells in the same row as the cell. Therefore, the reference model 250 comprises relatively a small number of bits to describe all the possible states of the matrix 200. In some exemplary embodiments, the reference model 250 is relatively easy and simple to design and examine that it preserves the specification. In some exemplary embodiments, the matrix 200 is a sparse matrix. Therefore, the number of possible states in the matrix is relatively smaller than the possible combinations of values in the cells of the matrix 200. The disclosed subject matter enables a reduction in the number of states by modeling the reference model 250 to require a relatively smaller number of bits to describe each state.

It will be noted that the reference model 250 may provide the behavior required by the specification. As the index reference 280 may have a non-deterministic value, the reference model 250 may describe values of the entire matrix using one exemplary row. It will be further noted, that the reference model 250 may utilize a column, a row, a diagonal or the like to model the matrix 200. It will be further noted that the matrix may have more than two dimensions, and the reference model may be modeled with less dimensions, such as for example one less dimension than the number of dimensions of the matrix.

In an exemplary embodiment of the disclosed subject matter, the matrix 200 may represent dependencies between processes. A row in the matrix 200 such as the row 202, represents a dependency of a process on other processes. An identifier of a process is utilized as an index of a relevant row in the matrix 200. A column, such as the column 220, represents whether any process depends on a specific process. The identifier of a process is utilized as an index of a relevant column in the matrix 200. A value of a cell in the row 202 and the column 220 is either ONE, indicating TRUE or ZERO, indicating FALSE. The value is TRUE is a first process represented by row 202 depends upon a second process represented by column 220.

In the exemplary embodiment, a load operation may be defined. The load operation may perform a loading of a dependency list of a process to the matrix 200. The load operation may be associated with a row index. A clear operation may be defined. The clear operation may clear a column in the matrix 200, for example, in response to a process associated with the column being executed, finalizing execution, releasing shared resources or the like. In some other exemplary embodiments, there may be other operations such as an operation associated with a column. The operation may depend on a value of a cell in a different column and the same row. In a similar manner, an operation may be associated with a row and depend on the value of a cell in a different row and the same column. It will be noted that there may be multiple operations associated with the matrix 200.

In the exemplary embodiment, the reference model 250 comprises the reference index 280. The reference index 280 is associated with a row index. The reference module 250 comprises of a row of cells, such as the cells 252, 254, 256, 258 and 260. The row of cells is associated with one row in the matrix 200 in a nondeterministic manner, such that it may be associated with any row in the matrix 200. For example, the row index may be defined in GDL as follows: "init Row_index<={0 . . . n};". The row may be referred to as an array of variables named "Matrix_ref". In response to a load operation associated with the Row_index, the Matrix_ref may be modified. A behavior of the Matrix_ref may be defined as follows: "next Matrix_ref<=row_data when (load=Row_index) else Matrix_ref;". Note that row_data is a content of row being loaded, and load defines whether a load operation is performed and in case a load operation is performed, to which row the row_data is loaded. A behavior of the matrix_ref may further be defined to incorporate other operations, such as a clear operation. For example, using the following statement: "next Matrix_ref(clear_index)<=clear_value when clear else Matrix_ref(clear_index);". Clear may indicate whether clear operation is performed. Clear_index may indicate which column is cleared. Clear_value may indicate a value that is assigned to the cell upon a clear operation, such as for example ZERO or FALSE. In some exemplary embodiments, an assertion statement may be defined to verify that the content of the reference model 250 is identical to the relevant portion of the matrix 200. For example, "assert always (Matrix(Row_index))=(Matrix_ref);", where Matrix indicates the matrix 200. In some exemplary embodiments, a function f of a content of row may be verified using the following assertion: "assert always f(Matrix(Row_index))=f(Matrix_ref);".

Figure 3:
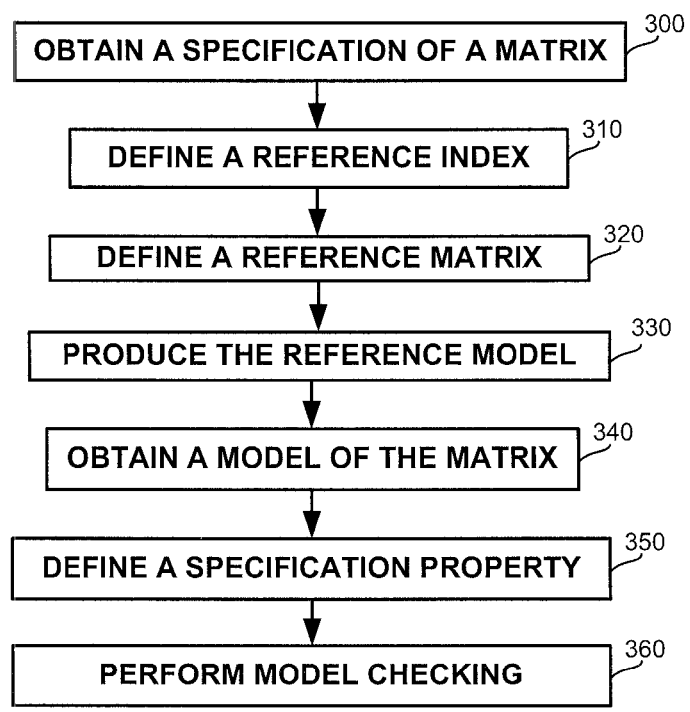
FIG. 3 shows a flowchart diagram of a method, in accordance with some exemplary embodiments of the disclosed subject matter.

Referring now to FIG. 3 showing a flowchart diagram of a method, in accordance with some exemplary embodiments of the disclosed subject matter.

In step 300, a specification is obtained. The specification may be obtained by a verification engineer or by an automated process. The specification may be provided by a specification designer or a developer of the target computerized system. The specification may be provided in a written document, be explained orally, provided in a computer-readable media and the like. In some exemplary embodiments, the specification is of a target computerized system comprising a matrix, such as matrix 200 of FIG. 2. The specification may be of a target computerized system consisting only of the matrix. The specification may be of a target computerized system comprising of other elements in addition to the matrix.

In step 310, a reference index is defined, such as for example the reference index 280 of FIG. 2. The reference index may be configured to have a non-deterministic value. The reference index may be utilized to define a reference model comprising a reference matrix having fewer dimensions than the matrix. In some exemplary embodiments, more than one reference index may be utilized to provide for a reference model comprising a reference matrix having one or more dimensions. For example, in case the matrix has three dimensions, the reference matrix may have one dimension and two reference indices be provided. The reference matrix may represent a sub-matrix of the matrix having a predetermined dimension fixated. For example, the reference matrix may have two dimensions, and represent a sub-matrix of a matrix having three-dimensions, wherein a predetermined dimension, such as for example the first dimension, is fixated to a predetermined constant of the value of the reference index. In some exemplary embodiments, the reference index has a non-deterministic value that may be any of the values of the predetermined dimension. Therefore the reference matrix may represent all possible sub-matrices of the matrix. In some exemplary embodiments, the matrix may represent a portion of all possible sub-matrices of the matrix, such as for example when the verification engineer determines that verification is to be executed in respect to the portion. In some other exemplary embodiments, the verification engineer may utilized the disclosed subject matter to determine a first portion and a second portion and provide for two reference models, each associated with a different portion.

In step 320 a reference matrix is defined. As disclosed above, the reference matrix may represent a sub-matrix of the matrix having a predetermined dimension fixated. The reference matrix may comprise one or more reference cells. A reference cell may be associated with a group of cells in the matrix. In an exemplary embodiment, the matrix is a two-dimensional matrix comprising of cells organized in either rows or columns. A reference matrix may be a row of reference cells wherein each reference cell is associated with every cell in the corresponding column in the matrix. The first reference cell is associated with the first column in the matrix, the second reference cell is associated with the second column in the matrix and so forth.

A value of a reference cell may depend on the value of the reference index. In some exemplary embodiments, a reference cell has a value that corresponds to the value of a cell in the matrix of the associated column and in a row that is determined by the reference index, such as in case the reference index is two, the first reference cell may have the value associated with a cell in location [2, 1] in the matrix (i.e., second row, first column).

In some exemplary embodiments of the disclosed subject matter, the reference cell corresponds to a cell in the matrix having a row index that is computed based on a row function. The row function may be the reference index. The row function may be a computation based on the value of a column function, such as to enable the reference matrix to correspond to a diagonal array in the matrix. The row function may be based upon the column index, row index or the like of the reference cell in the reference matrix. Other row functions are also available and enable a reference cell to refer to any kind of array of cells in the matrix. In a similar manner, a column function may be defined and utilized.

In some exemplary embodiments, the reference matrix may comprise an array of three reference cells: a first cell, a second cell and a third cell. The value of the first cell corresponds to a value of a cell in the matrix in the first column and in a row pointed by the reference index. The value of the second cell corresponds to a value of a cell in the matrix in the second column and in a row pointed by the reference index and so forth.

In step 330, the reference model is produced. The reference model may be produced by a verification engineer, a person, a computerized device or the like. The reference model may be produced in a manual, semi-automatic or fully automatic process. The reference model may be produced in a computer readable media such as a digital file, a digital data relayed via a signal, a storage device, a paper printout or the like. The reference model may be defined using a descriptive language, such as EDL, GDL, VHDL, Verilog, SystemC, Java, UML, PSL or the like.

In step 340, a model representing the matrix is obtained. In some exemplary embodiments, the model represents the target computerized system comprising the matrix.

In step 350, a specification property may be defined. Such as for example, that an output provided by the reference matrix is always the same as the output provided by the model of the matrix.

In step 360, model checking may be performed to verify that the specification property is held. The model checking may be performed by a model checker such as a BDD-based model checker, a SAT-based model checker, an Abstraction-Refinement model checker, a symbolic model checker, an explicit model checker, a simulator or the like. The model checker may provide a counter-example refuting the specification property. A verification engineer may further examine the counter-example to determine whether a bug in the model caused the counter-example or a bug in the reference model. It will be noted that since the reference model is relatively small and easy to define, it is more likely that the counter-example may be caused by a discrepancy between the model and the specification of the target computerized system. It will be further noted that as the reference model comprises non-deterministic behavior, a model checker is likely to perform model checking on it faster and using fewer number of states. This may be more likely in case the model checker is a symbolic model checker such as a BDD-based model checker or the like.

In model checking a model having a large number of state may not be model checked by some or even all model checkers due to the well known state explosion problem. The reference model has a better likelihood of being able to be model checked by the model checker than another reference model not in accordance with the disclosed subject matter.

Figure 4:
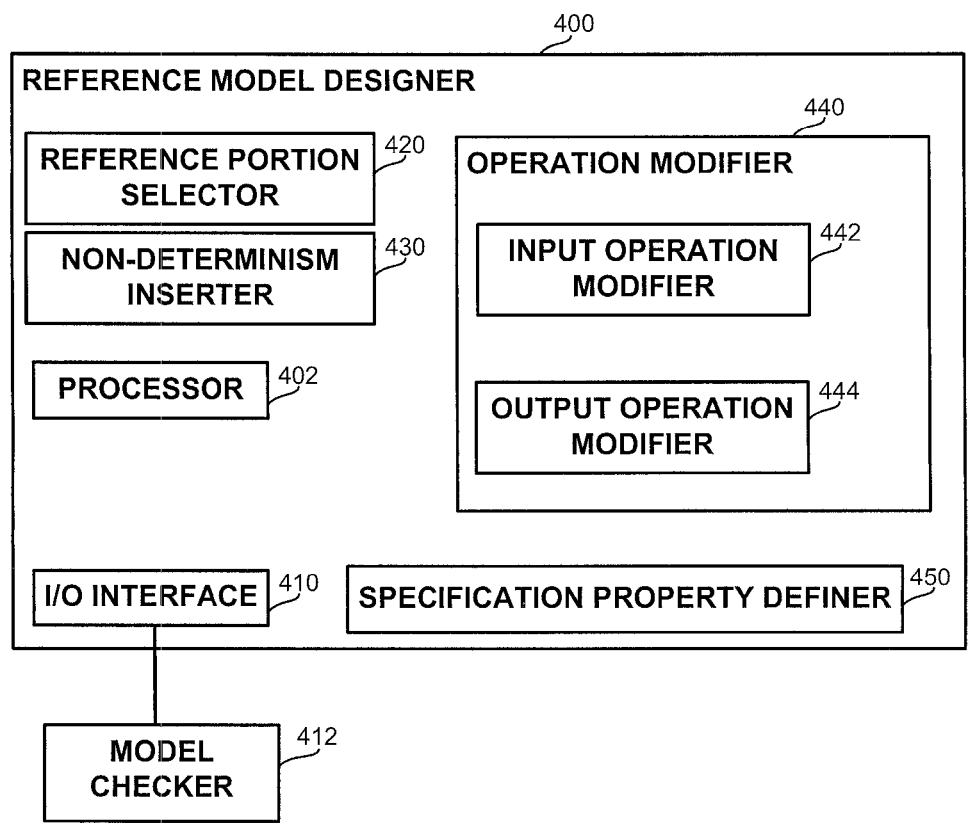
FIG. 4 shows a block diagram of a reference model designer, in accordance with some exemplary embodiments of the disclosed subject matter.

Referring now to FIG. 4 showing a block diagram of a reference model designer, in accordance with some exemplary embodiments of the disclosed subject matter. A reference model designer 400 may be a computerized apparatus for determining a reference model associated with a matrix. In some exemplary embodiments, the reference model designer 400 may be defined using a programming language, such as Perl, Java, C++, JavaScript or the like.

In some exemplary embodiments, the reference model designer 400 may comprise an interface, such as an I/O interface 410. The I/O interface 410 may be configured to obtain a specification of a matrix, a model comprising a matrix or the like. The I/O interface 410 may be configured to output a reference model defined by the reference model designer 400. The I/O interface 410 may be configured to utilize a model checker 412, such as for example by utilizing an API of the model checker 412. The model checker 412 may be utilized to verify a property specification, such as an assertion specification. The model checker 412 may be for example model checker 140 of FIG. 1. The property specification may be associated with the reference model. The I/O interface 410 may be configured to obtain a description of an operation associated with the matrix, such as a load row operation, a clear column operation, an input operation, an output operation or the like. The description of the operation may comprise an indication of a trigger variable, a parameter variable, a content of an operation performed by the operation, such as assignment, performing OR, XOR or the like.

In an exemplary embodiment of the disclosed subject matter, the reference model designer 400 further comprises a processor 402. The processor 402 may be a Central Processing Unit (CPU), a microprocessor, an electronic circuit, an Integrated Circuit (IC) or the like. The processor 402 may be utilized to perform computations required by the reference model designer 400 or any of it subcomponents.

In some exemplary embodiments, the reference model designer 400 comprises a non-determinism inserter 430. The non-determinism inserter 430 may be configured to define a reference model. The non-determinism inserter 430 may determine a reference index and define a non-deterministic behavior of the reference index, such as being initialized with an index that corresponds with a portion of the rows in the matrix. The non-determinism inserter 430 may be configured to define a list of one or more cells. The list may be associated with the reference index, such that a value of the reference index indicates a portion of the matrix that the list refers to. For example, the list may be associated with a first row having a row index value of four in case the value of the reference index is four; and the list may be associated with a second row having a row index value of ten in case the value of the reference index is ten. In another example, the list may be associated with a first row having a row index value of four in case the value of the reference index is zero; and the list may be associated with a second row having a row index value of ten in case the value of the reference index is one.

In some exemplary embodiments, the reference model designer 400 further comprises an operation modifier 440. The operation modifier 440 may determine a behavior of the list based upon a behavior of a portion of the matrix. For example, a behavior of a load operation on the matrix may be utilized to determine a behavior of the list, based on, in addition, the value of the reference index.

In some exemplary embodiments, the operation modifier 440 further comprises an input operation modifier 442 for determining a behavior of the reference model based on an input operation, such as a load operation. An input operation may comprise a behavior based upon values of variables that are not associated with the matrix, such as a load variable, a row_data variable or the like.

In some exemplary embodiments, the operation modifier 440 further comprises an output operation modifier 444 for determining a behavior of the reference model based on an output operation. An output operation may be any operation that is not an input operation. For example, an operation that depends on a value of a cell of the matrix is considered an output operation. In some exemplary embodiments, a value of an output operation is utilized in order to verify a model of the matrix.

In some exemplary embodiments, the reference model designer 400 comprises a specification property definer 450 for determining a specification property. The specification property may be an assertion property. The specification property may be an assertion that the value of the list in the reference model is equal to an associated portion of the matrix. The specification property may be an assertion that an output value of the reference model is equal to an associated output value in the matrix.

In some exemplary embodiments, the reference model designer 400 comprises a reference portion selector 420. The reference portion selector 420 may indicate a portion of a matrix that may be utilized in modeling in the reference model. For example, the reference portion selector 420 may determine that a list of cells may be used to refer to a portion of the matrix, such as for example, a row in the matrix, a column in the matrix or the like.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of program code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As will be appreciated by one skilled in the art, the disclosed subject matter may be embodied as a system, method or computer program product. Accordingly, the disclosed subject matter may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, and the like.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising:
    obtaining a specification of a matrix, the matrix has a first predetermined dimension, the matrix comprises one or more cells, each cell having a value, the specification comprises a transition relation defining transformation of a first state of the matrix to a second state of the matrix;
    defining, by a computer, a reference model of the matrix comprising:
        defining a reference index, the reference index has a non-deterministic value;
        defining a reference matrix comprising one or more reference cells, the reference matrix having a second predetermined dimension, the second predetermined dimension is smaller than the first predetermined dimension, each of the reference cells corresponds to two or more cells of the matrix, wherein the reference model preserves the specification, a value of a portion of the reference cells depends on a value of the reference index; and
        producing the reference model on a non-transitory computer readable media;
    performing, by the computer, formal verification using the reference model;
    whereby the matrix is transformed to a reference model, preserving a behavior defined by the specification, and whereby the reference model comprises a fewer number of cells than the matrix.

2. The method of claim 1, wherein the matrix is a sparse matrix.

3. The method of claim 1, wherein the matrix is a two-dimensional array.

4. The method of claim 1, wherein the matrix has more than two dimensions.

5. The method of claim 1, wherein the specification further comprising a definition of one or more initial states.

6. The method of claim 1, wherein the specification further comprising a behavior of an output variable.

7. The method of claim 1, wherein the reference matrix is selected from a group consisting of a column in the matrix, a row in the matrix and a sub-matrix of the matrix having a predetermined dimension fixated.

8. The method of claim 1, wherein a reference cell corresponds to a cell in the matrix having a row index, the row index is computed based on a row function, the row function provides a value based on a value of the reference index.

9. The method of claim 1, wherein a reference cell corresponds to a cell in the matrix having a column index, the column index is computed based on a column function, the column function provides a value based on a value of the reference index.

10. The method of claim 9, wherein the cell further having a row index, the row index is computed based on a row function, the row function provides a value based on a value selected from a group consisting of the reference index and the column index.

11. The method of claim 1 further comprising model checking a model of the matrix in respect to the reference model.

12. The method of claim 11, wherein said model checking a model of the matrix in respect to the reference model comprises utilizing a model checker.

13. The method of claim 11, wherein said model checking a model of the matrix in respect to the reference model comprises: defining a property holding that a value of a portion of the model the matrix is equal to a corresponding value of a portion of the reference model; and utilizing a model checker to determine whether the property is held.

14. A computer program product comprising:
    a non-transitory computer readable medium;
    first program instruction for obtaining a specification of a matrix, the matrix has a first predetermined dimension, the matrix comprises one or more cells, each cell having a value, the specification comprises a transition relation defining transformation of a first state of the matrix to a second state of the matrix;
    second program instruction for defining a reference model of the matrix comprising:
        third program instruction for defining a reference index, the reference index has a non-deterministic value;
        fourth program instruction for defining a reference matrix comprising one or more reference cells, the reference matrix having a second predetermined dimension, the second predetermined dimension is smaller than the first predetermined dimension, each of the reference cells corresponds to two or more cells of the matrix, wherein the reference model preserves the specification, a value of a portion of the reference cells depends on a value of the reference index; and
        fifth program instruction for producing the reference model on a computer readable media; and
    sixth program instruction for formal verification using the reference model;

wherein said first, second, third, fourth and fifth program instructions are stored on said non-transitory computer readable media.

* * * * *